United States Patent [19]
Rokutan

[11] Patent Number: 4,612,508
[45] Date of Patent: Sep. 16, 1986

[54] MODIFIED MILLER DATA DEMODULATOR

[75] Inventor: Takao Rokutan, Hachioji, Japan

[73] Assignee: Olympus Optical Co., Ltd, Tokyo, Japan

[21] Appl. No.: 772,507

[22] Filed: Sep. 4, 1985

[30] Foreign Application Priority Data

Sep. 29, 1984 [JP] Japan ................................ 59-202981

[51] Int. Cl.$^4$ ............................................. H03M 7/00
[52] U.S. Cl. ........................................ 329/50; 329/104; 360/40; 360/44; 375/94; 340/347 DD; 332/1
[58] Field of Search ...................... 332/1; 329/50, 104, 329/107, 106; 375/94; 360/40, 41, 44, 51, 29; 340/347 DD

[56] References Cited

U.S. PATENT DOCUMENTS 4,027,335  5/1977  Miller ..................................... 360/40
4,227,184 10/1980  Howells et al. ................... 360/43 X Primary Examiner—Siegfried H. Grimm
Attorney, Agent, or Firm—Armstrong, Nikaido, Marmelstein & Kubovcik

[57] ABSTRACT

A data demodulator is composed of a data separation circuit which produces synchronizing clock pulses from $M^2$ modulation data which is reproduced by a data recording device and separates the $M^2$ modulation data into clock bits and data bits, and an $M^2$ demodulation circuit which produces NRZ - L data by using the clock bits, data bits and synchronizing clock pulses which are output from the data separation circuit. $M^2$ modulation data which is input to the $M^2$ demodulation circuit is demodulated to a data signal in NRZ - L format by the demodulation circuit, which has a simple structure.

2 Claims, 5 Drawing Figures

MODIFIED MILLER DATA DEMODULATOR

BACKGROUND OF THE INVENTION

This invention relates to a demodulator for digital data which has been subjected to $M^2$ (Modified Miller) modulation.

Various modulation formats have hitherto been proposed for transferring digital data in serial binary form to a recording medium such as a magnetic tape. One of such modulation formats is the $M^2$ modulation format, which is described in detail in, for example, the specification of U.S. Pat. No. 4,027,335, and in which binary data are encoded in binary waveforms not including a component of direct current.

In an RZ (return-to-zero) format, which is another of the modulation formats for digital data in serial binary form, as is shown in FIG. 1(C), binary data are caused to correspond with the logical state (FIG. 1(B)) synchronously with clock pulses (FIG. 1(A)) and returned to a reference level between data bits. The NRZ - L (non-return-to-zero level) format and the NRZ - I (non-return-to-zero invert) format are improvements of the RZ format with the aim of heightening the recording density thereof. In the NRZ - L format, as is shown in FIG. 1(D), binary data are converted synchronously with a clock in correspondence with the logic state level of the binary data without returning to a reference level between data bits, and in the NRZ - I format, as is shown in Fig. (E), the polarity of binary data is inverted by causing it to transit synchronously with clock pulses only when the logical value of the binary data is 1.

Both NRZ formats, however, involve the risk of generation of a serious timing error because a signal maintains one or the other state for a comparatively long time. In addition, a transmission line for these formats requires a direct current transmission facility.

U.S. Pat. No. 3,108,261 discloses the Miller format in which the above-described defects are ameliorated. This format is, as is shown in FIG. 1(F), so constructed as to generate transition at an intermediate portion of each data bit of logical value 1 in binary data, and at the leading edge of each bit of logical value 0, except for a bit of logical value 0 which succeeds to a bit of logical value 1.

Though this Miller format requires a smaller bandwidth as compared with the NRZ formats, it does not exclude a component of direct current. Therefore if the transmission line has no direct current transmission facility, an error is generated.

A modification of the Miller format which enables the removal of the direct current component is the above-described format which is called $M^2$ (Modified Miller) format. In this format, when an even number of data bits of the logical value 1 are in succession and an accumulated charge is not zero, transition is suppressed, as is shown in FIG. 1(G), thereby removing any component of direct current.

A demodulation system for decoding digital data which has been subjected to $M^2$ modulation is also disclosed in U.S. Pat. No. 4,027,335. This demodulation system, however, in which NRZ - L type demodulated data is obtained by means of a multiplicity of direct conversion operations in relation to input data which has been subjected to $M^2$ modulation (hereinunder referred to as $M^2$ modulation data), requires a very complicated circuit structure.

Recently, a data separation circuit for separating $M^2$ modulation data into data bits and clock bits by producing synchronizing clock pulses from $M^2$ modulation input data, as is shown in FIG. 2, has been easily available as a single unit. However, no format for demodulating the $M^2$ modulation data by utilizing the data separation circuit which produces such an output has yet been proposed.

SUMMARY OF THE INVENTION

Accordingly, it is an object of the invention to eliminate the defects of an $M^2$ demodulator having a structure such as is disclosed in the above-described U.S. Patent, and to provide a demodulator for $M^2$ modulation data which facilitates demodulation of $M^2$ modulation data to NRZ-L (non-return-to-zero-level) data.

To achieve this aim, a data demodulator according to the invention is composed of a data separation circuit for producing synchronizing clock pulses from $M^2$ modulation data which is reproduced by a data recording device and separating the $M^2$ modulation data into clock bits and data bits, and an $M^2$ modulation data demodulation circuit for producing NRZ - L data by utilizing the clock bits, data bits and synchronizing clock pulses which are output from the data separation circuit.

This structure enables the $M^2$ modulation data which is input to the $M^2$ demodulation circuit to be easily demodulated to an NRZ - L type data signal by means of a very simple circuit structure.

DESCRIPTION OF THE PREFERRED EMBODIMENT

Figure 1:
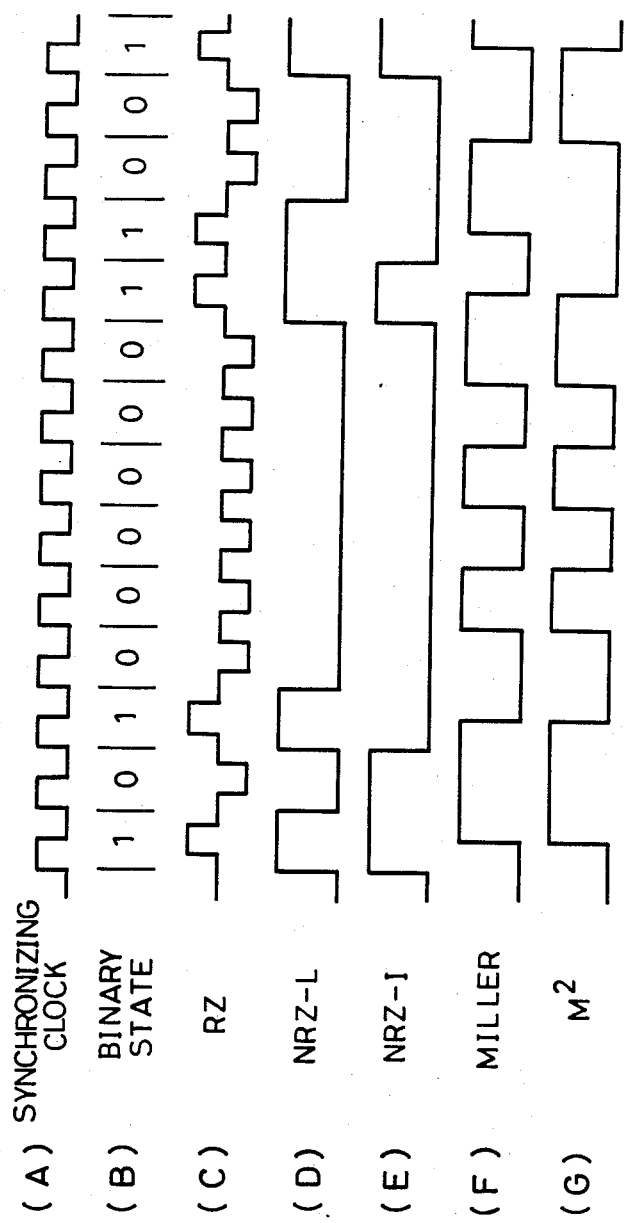
FIG. 1 shows various modulation formats for digital data in serial binary form.
Figure 2:
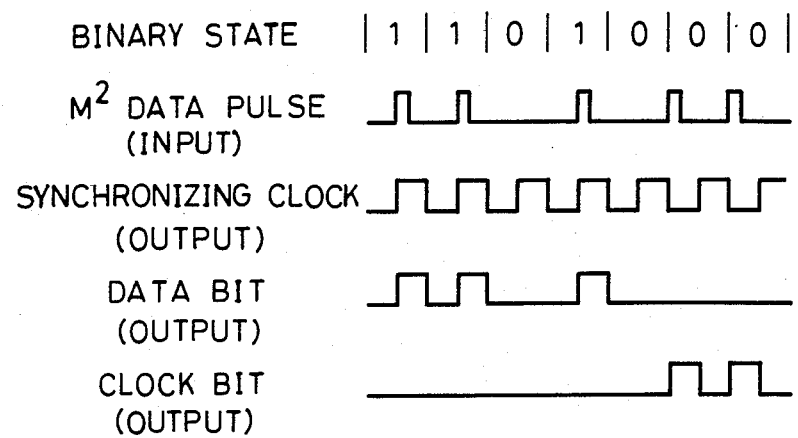
FIG. 2 shows input/output signals of the data separation circuit used for this invention.
Figure 3:
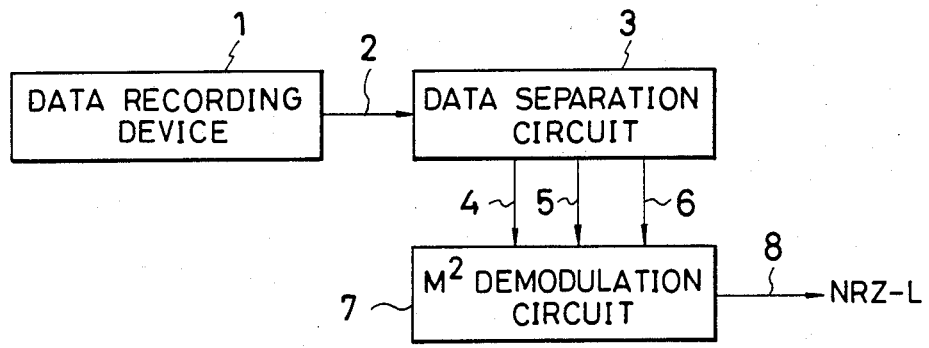
FIG. 3 is a block diagram of the entire structure of an embodiment of the invention.

An embodiment of the invention will be explained in the following. FIG. 3 is a block diagram of the entire structure of the embodiment. The referential numeral 1 represents a data recording device. Digital data 2 which has been subjected to $M^2$ modulation and recorded in the recording device 1 is reproduced and input into a data separation circuit 3. The data separation circuit 3 produces a synchronizing clock signal 4 from the $M^2$ modulation digital data 2, thereby separating the $M^2$ modulation data into a clock bit signal 5 and a data bit signal 6. An $M^2$ demodulation circuit 7 demodulates the data by using the synchronizing clock signal 4, clock bit signal 5 and data bit signal 6, and outputs NRZ - L demodulation data 8. As for a data separation circuit 3, a usable circuit on the market is one which is generally used for an image processing device and is made into the form of an IC, for example, DP - 8460 which is produced by National Semiconductor Co. in U.S.A.

Figure 4:
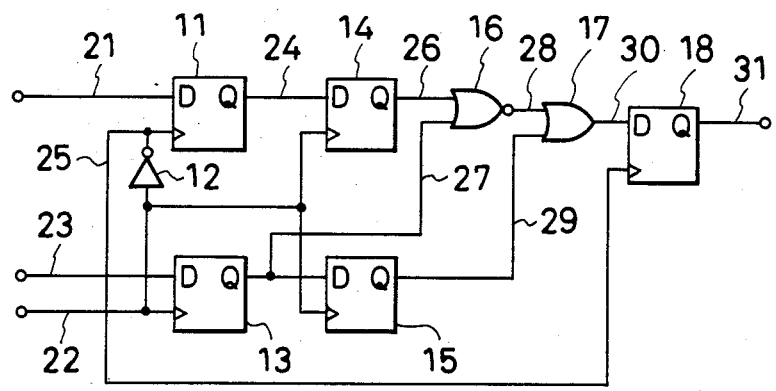
FIG. 4 shows an example of the structure of an $M^2$ demodulation circuit according to the invention.
Figure 5:
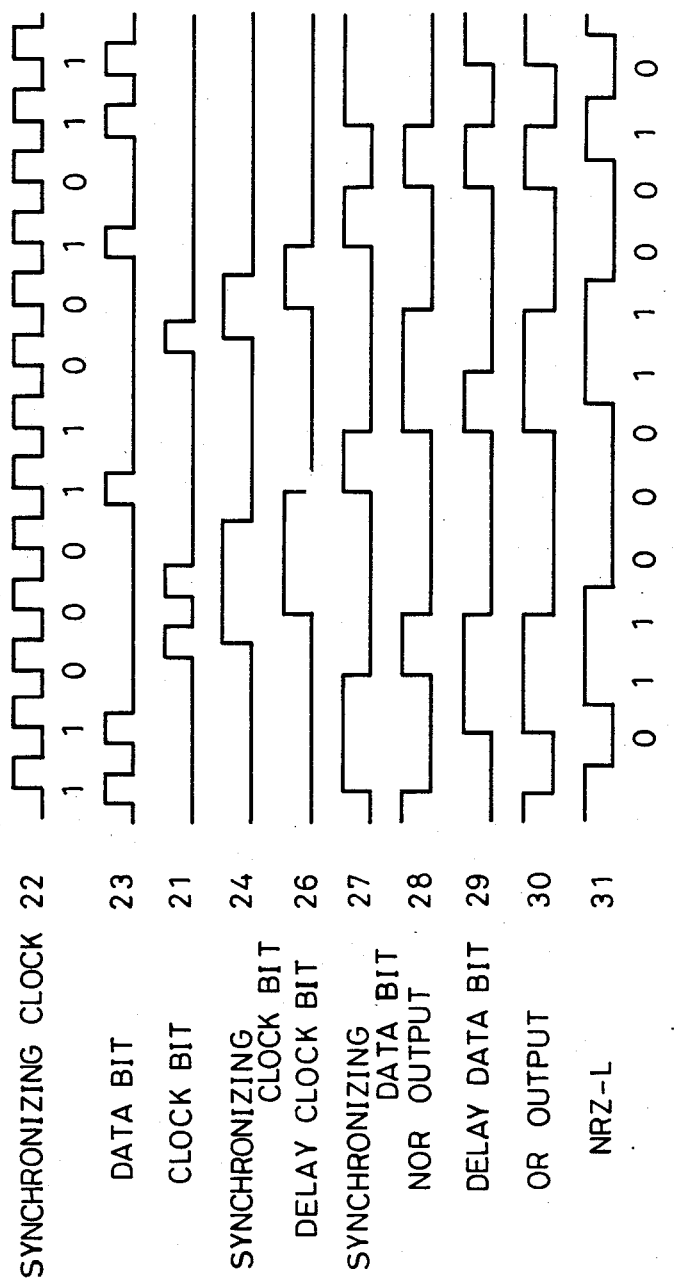
FIG. 5 is a timing chart which explains the operation of the $M^2$ demodulation circuit shown in FIG. 4.

The $M^2$ demodulation circuit shown in FIG. 4 will next be explained. This demodulation circuit is composed of five D flip-flops 11, 13, 14, 15 and 18, an NOR gate 16, an OR gate 17 and an inverter 12. A clock bit signal 21 is input to the data input terminal D of the D flip-flop 11. The input clock bit signal 21 is read at the leading edge of an inversion synchronizing clock signal 25, which is a synchronizing clock signal 22 inverted by the inverter 12, and the output signal from the output terminal Q is input into the D flip-flop 14 as a synchronizing clock bit signal 24. A data bit signal 23 is input into the D flip-flop 13. The input signal 23 is read at the leading edge of the synchronizing clock signal 22, and the output signal from the output terminal Q is input to the input terminal D of the D flip-flop 15 and one of the input terminals of the NOR gate 16 as a synchronizing data bit signal 27.

The D flip-flop 14 receives the synchronizing clock bit signal 24, which is read at the leading edge of the synchronizing clock signal 22, and the output from the output terminal Q of the D flip-flop 14 is input to the other terminal of the NOR gate 16 as a delay clock bit signal 26. The synchronizing data bit signal 27 is supplied to the D flip-flop 15 and is read at the leading edge of the synchronizing clock signal 22, and the output from the output terminal Q of the D flip-flop 15 is input to one of the input terminals of the OR gate 17 as a delay data bit signal 29. The output of the NOR gate 16 is input to the other input terminal of the OR gate 17, the output of which is input to the input terminal D of the D flip-flop 18. The D flip-flop 18 is so designed as to read the output 30 delivered from the OR gate 17 at the leading edge of the inversion synchronizing clock signal 25, which is the synchronizing clock signal 22 inverted by the inverter 12 and to output an NRZ - L signal 31 from the output terminal Q. Incidentally, it is for the purpose of removing minute spikes in the form of whiskers which are contained in the output 30 from the OR gate 17 that the D flip-flop 18 is provided.

The operation of the $M^2$ demodulation circuit having this structure will now be explained. The clock bit signal 21 which is separated by the data separation circuit 3 is input into the D flip-flop 11, in which the input signal 21 is read at the leading edge of the inversion synchronizing clock signal 25, which is the inverted synchronizing clock signal 22, whereby the synchronizing clock bit signal 24 which is synchronous with the trailing edge of the synchronizing clock signal 22 is obtained.

Similarly, the data bit signal 23 is input to the D flip-flop 13, in which it is read at the leading edge of the synchronizing clock signal 22, whereby the synchronizing data bit signal 27 which is synchronous with the leading edge of the synchronizing clock signal 22 is obtained.

The synchronizing clock bit signal 24 is input to the D flip-flop 14 and is read at the leading edge of the synchronizing clock signal 22, whereby the delay clock bit signal 26 which is delayed by ½ clock pulse with respect to the synchronizing clock bit signal 24 is obtained.

Similarly, the synchronizing data bit signal 27 is input to the D flip-flop 15 and read at the leading edge of the synchronizing clock signal 22, the delay data bit signal 29 which is delayed by 1 clock pulse with respect to the synchronizing data bit signal 27 thereby being obtained.

The delay clock bit signal 26 and the synchronizing data bit signal 27 are next input into the NOR gate 16, whereby the NOR output signal 28 is obtained. Further, the NOR output signal 28 and the delay data bit signal 29 are input into the OR gate 17, whereby the OR output signal 30 is obtained.

The OR output signal 30 is then input to the D flip-flop 18, and read at the leading edge of the inversion synchronizing clock signal 25, whereby the NRZ - L signal 31 which is synchronous with the trailing edge of synchronizing clock signal 22 is obtained.

Though in this embodiment NRZ - L data is obtained from the delay clock bit signal 26, synchronizing data bit signal 27, and delay data bit signal 29 by using the NOR gate and the OR gate, it is also possible to form NRZ - L data by a combination of other logical circuits, or by a combination of the NOR and/or OR gate with other logical circuits.

As has been described in the explanation of the embodiment, an $M^2$ demodulation circuit according to the invention having the above-described structure facilitates the demodulation of an $M^2$ modulation data which is to be input to the $M^2$ demodulation circuit to a data signal of an NRZ - L type by means of a demodulation circuit having a simple structure and by using a synchronizing clock signal, data bit signal, and a clock bit signal which are obtained from a data separation circuit.

What is claimed is:

1. A data demodulator comprising:
    a data recording device in which is recorded digital data which has been subjected to $M^2$ modulation;
    a data separation circuit for producing synchronizing clock pulses from said data which has been subjected to $M^2$ modulation and been reproduced by said recording device, and for separating said data into clock bits and data bits; and
    an $M^2$ modulation data demodulation circuit for producing NRZ - L data by using said clock bits, data bits and synchronizing clock pulses which are output from said data separation circuit.

2. A data demodulator according to claim 1, wherein said $M^2$ modulation data demodulation circuit is composed of:
    means for obtaining a delay clock bit signal which is formed by delaying said clock bits by ½ clock pulse in synchronization with one edge of said synchronizing clock pulses;
    means for obtaining a synchronizing data bit signal which is formed by synchronizing said data bits with the other edge of said synchronizing clock pulses;
    means for obtaining a delay data bit signal which is formed by delaying said data bit signal by one clock pulse;
    means for outputting data which is equivalent to an output signal obtained by means of the logical sum operation of a delay data bit signal and an output signal obtained by means of the NOR operation of said delay clock bit signal and said synchronizing data bit signal; and
    means for outputting the output signal of said means for outputting data in synchronization with said synchronizing clock pulses.

* * * * *